United States Patent [19]

Endo

[11] Patent Number: 5,360,989

[45] Date of Patent: Nov. 1, 1994

[54] MIS TYPE CAPACITOR HAVING REDUCED CHANGE IN CAPACITANCE WHEN BIASED IN FORWARD AND REVERSE DIRECTIONS

[75] Inventor: Koichi Endo, Tokyo, Japan

[73] Assignee: Kabushiki Kaisha Toshiba, Kawasaki, Japan

[21] Appl. No.: 60,066

[22] Filed: Apr. 20, 1993

Related U.S. Application Data

[63] Continuation of Ser. No. 716,996, Jun. 18, 1991, abandoned.

[30] Foreign Application Priority Data

Jun. 18, 1990 [JP] Japan .................. 2-159364

[51] Int. Cl.$^5$ .................................. H01L 27/02
[52] U.S. Cl. .................. 257/532; 257/533; 257/535; 257/577
[58] Field of Search ............... 257/532, 533, 535, 577, 257/593

[56] References Cited

U.S. PATENT DOCUMENTS 4,247,826  1/1981  Gappa et al. ............... 357/42

FOREIGN PATENT DOCUMENTS 58-132958  8/1983  Japan .................. 257/532
59-117256  7/1984  Japan .
60-169162  9/1985  Japan .................. 257/533
62-92459   4/1987  Japan .................. 257/533

OTHER PUBLICATIONS

Patent Abstracts of Japan, vol. 8, No. 235 (E-275)(1672) Oct. 27, 1984 & JP-59 117 256 (Hitachi) Jul. 6, 1984.
IBM Technical Disclosure Bulletin, vol. 23, No. 3, Aug. 1980, p. 1091; H. V. Roeder: 'Controllable Mos Capacitor'.

*Primary Examiner*—J. Carroll
*Attorney, Agent, or Firm*—Oblon, Spivak, McClelland, Maier & Neustadt

[57] ABSTRACT

An MIS capacitor for bipolar integrated circuits includes an island region of one conductivity type, a first semiconductor layer of one conductivity type formed in the island region, an insulating layer provided on the first semiconductor layer, a capacitor electrode provided on the insulating layer to provide an MIS capacitor element, and a second semiconductor layer of an opposite conductivity type for providing a PN junction with the first semiconductor layer. When the MIS capacitor element is reverse biased, majority carriers of the second semiconductor layer are supplied to a depletion layer generated in the first semiconductor layer, thereby providing an MIS capacitor having an approximately constant capacitance even if it is biased in a forward or reverse direction.

2 Claims, 4 Drawing Sheets

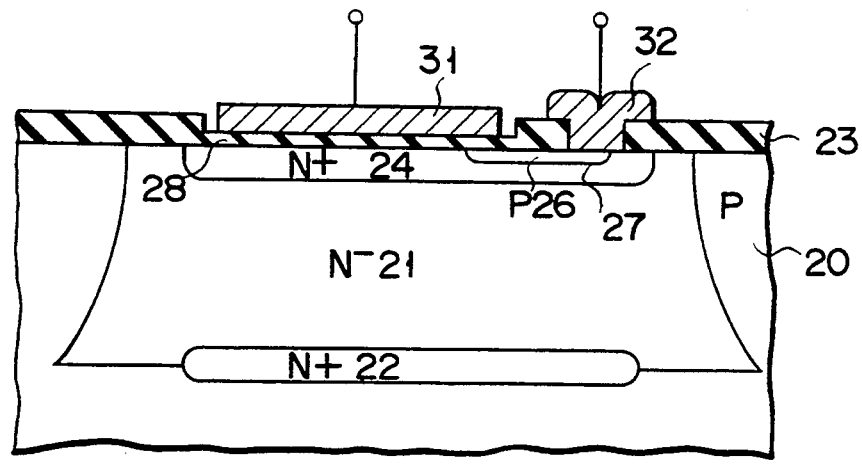
F I G. 5A
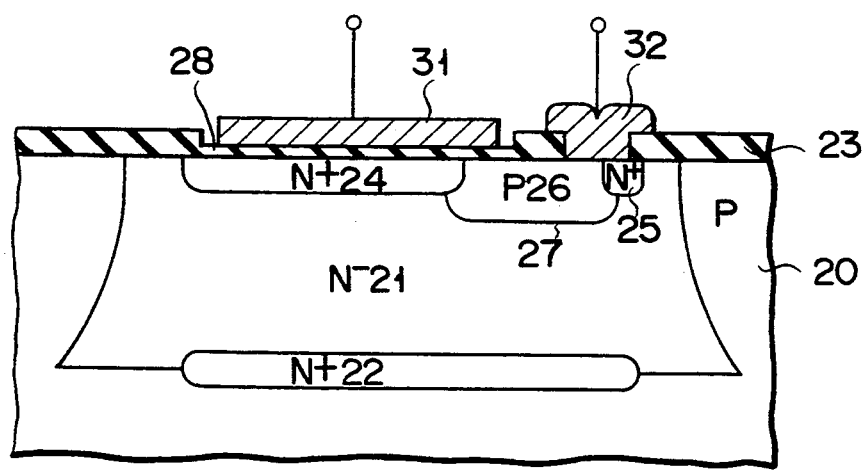
F I G. 5B

MIS TYPE CAPACITOR HAVING REDUCED CHANGE IN CAPACITANCE WHEN BIASED IN FORWARD AND REVERSE DIRECTIONS

This application is a continuation Ser. No. 07/716,996, filed on Jun. 18, 1991, now abandoned.

BACKGROUND OF THE INVENTION

1. Field of the Invention

The present invention relates to an MIS (MOS) capacitor for an integrated circuit and, more particularly, to an MIS (MOS) capacitor for a bipolar integrated circuit.

2. Description of the Related Art

An MIS (MOS) capacitor has been utilized as a part of a bipolar IC or a MOS IC which is monolithically formed in a semiconductor substrate, e.g., a silicon substrate. An MIS capacitor formed in a bipolar IC will be described below with reference to FIG. 1.

After an N⁻-type island region 2 having an N⁺-type buried region 3 is formed in a P-type semiconductor substrate 1, an N⁺-type semiconductor layer 4 is provided in the N⁻-type island region 2, and a first metal electrode 7 is provided on a thin insulating layer 5 formed on the N⁺-type semiconductor layer 4. A second metal electrode 8 is provided on the N⁺-type semiconductor layer 4 through an opening formed in a thick insulating layer 6 such as a field insulating layer, thereby providing an MIS capacitor 9.

As shown in FIG. 4, a capacitance C14 of the MIS capacitor 9 is provided by a capacitance Cox10 of the insulating layer 5 and a capacitance Csll of the surface of the semiconductor layer 4 connected in series with each other. In this case, the capacitance Csll includes a capacitance Cdep 12 and a capacitance Cinv 13 which are connected in parallel with each other. The capacitance Cdep 12 is provided by impurity ions (donor ions in the case of N-type ions), while the capacitance Cinv 13 is provided by a carrier stored at a surface of the semiconductor layer 4. Although the capacitance Cox10 is constant without depending upon a bias voltage, the capacitance Csll depends on the bias voltage. In the structure, the MIS capacitor 9 is designed in such a manner that the depletion layer does not easily extend by increasing the impurity concentration of the semiconductor layer 4 (the capacitance Csll is sufficiently higher than the capacitance Cox10), and the capacitance C14 does not depend on the bias voltage as a whole.

As a method of making an insulating layer, chemical vapor deposition techniques as well as thermal oxidation techniques have been known. As a thin insulating layer, a silicon oxide film, a nitride film, a tantalum nitride film, or the like are given. As an electrode metal layer, polysilicon having good electric conductivity can be utilized in addition to metals such as aluminum.

In a conventional MIS capacitor, in order to reduce an unwanted resistance, a process for increasing the impurity concentration of the semiconductor layer is required as described above. On the contrary, if the impurity concentration is decreased, the capacitance of the capacitor depends on a bias voltage, and drawbacks to be described later may occur. In addition, when the capacitance Cox10 is increased by further decreasing the thickness of the thin insulating layer 5 so as to improve a capacitance per unit area, the impurity concentration of the semiconductor layer 4 must be increased. Therefore, crystal defects may occur in the semiconductor layer 4.

In general, a capacitor having the MIS (MOS) structure (an N-type semiconductor layer is used as a semiconductor layer for descriptive convenience) is given by the capacitance C14 which is provided by the capacitance Cox10 and the depletion layer capacitance Csll connected in series with each other as shown in FIG. 4. The capacitance Cox10 is defined by the dielectric constant of the thin insulating layer, its thickness, and its area, and the depletion layer capacitance Csll is defined by the dielectric constant of silicon, the width of depletion layer, and the inverted carrier distribution. In addition, the capacitance Csll is given by the capacitance Cdep12, caused by donor impurity ions, and the capacitance Cinv13, caused by the inverted carriers generated on the surface of the semiconductor layer 4.

In the MIS capacitor having the above structure, a positive voltage is applied to a first electrode 7 while a negative voltage is applied to a second electrode 8, i.e., the semiconductor layer 4. In such a forward bias condition, electrons of majority carriers are stored in the surface of the semiconductor layer 4 located below the insulating layer 5 as indicated by reference numeral 15 in FIG. 2A. In this state, since the capacitance Csll becomes very high, the capacitance C14 is approximately equal to the capacitance Cox10.

On the contrary, when a negative voltage is applied to the first electrode (reverse bias), as shown in FIG. 2C, holes of minority carriers are generated on the surface of the semiconductor layer 4 by the negative potential, thereby providing an inversion layer 16 therein. At this time, even if the voltage applied to the first electrode includes a DC bias or AC signal components, the capacitance Cinv13 is increased when the voltage is a low frequency. Accordingly, the capacitance C14 is approximately equal to the capacitance Cox10. However, if the reverse bias voltage includes high frequency components, a generation recombination rate of inversion carriers cannot follow a change in the high frequency components. Therefore, the capacitance Cinv13 is decreased, thereby decreasing the capacitance C14 of the capacitor.

When the first electrode 7 is in a zero bias state or the forward bias state is changed to the reverse bias state, electrons are excluded from the surface of the semiconductor layer 4 by the negative potential, thereby providing a depletion state 17 as shown in FIG. 2B. This state is called a deep depletion state. When a very high voltage is applied to the semiconductor layer 4, the capacitance C14 of the capacitor is decreased until breakdown occurs in the depletion layer. Few inversion carriers which are described above are present in this state.

It may be considered that since holes of the inversion carriers in the MIS structure using the N-type semiconductor are recombined with electrons from the positive electrode to the semiconductor surface, few holes reach the semiconductor surface, and a great number of holes are produced by electrons holes pairs. At this time, the electrons hole pairs are produced by light excitation if light is applied to the semiconductor layer. If crystal defects are formed in the semiconductor layer, they may serve as centers for generating electrons hole pairs. Accordingly, if the crystallinity of the semiconductor layer 4 is improved so as to obtain good characteristics of the capacitor, holes may not be easily produced.

FIG. 3 shows a relationship between an applied voltage vg to the capacitor (assuming that the semiconductor layer 4 is kept at a ground potential and the voltage Vg is applied to the first electrode 7) and the capacitance C14 of the capacitor. In the drawing, a solid line represents a high frequency response characteristic (about 100 Hz or more); a broken line, a low frequency response characteristic; an alternate long and short dashed line, a characteristic of a deep depletion layer; and Cox, a capacitance of the insulating layer 5 itself, respectively.

When the capacitor is operated under the DC state, it has the characteristic represented by the broken line in FIG. 3. Since the semiconductor surface becomes the inverted state even when the capacitor is biased in the reverse direction (negative bias), the capacitance of the capacitor has the same value as that when the capacitor is biased in the forward direction. When the reverse bias having the high-frequency components is applied to the capacitor, the characteristics represented by the solid line in FIG. 3 can be obtained, whereby the capacitance indicates the frequency dependence. When the capacitor is switched at a high speed or a surge voltage is applied to the capacitance, i.e., when an applied voltage is rapidly raised from a zero bias state, the capacitor becomes the deep depletion state. At this time, the capacitance C14 is further decreased so as to have a value represented by an alternate long and short dashed line in FIG. 3.

As described above, the actual capacitance C14 of the capacitor is different from a designed capacitance value of a semiconductor element except that the DC bias voltage is applied to the capacitor. In addition, since a decrease in the capacitance C14 of the capacitor means a decrease in energy accumulated in the capacitor, the capacitor may be broken when a high surge voltage is applied thereto.

As described above, in the conventional technique, since the capacitor is designed such that the impurity concentration of the semiconductor layer 4 is increased so as not to easily extend the the depletion layer (the capacitance Csll is increased), the capacitance is rarely decreased even in the depletion state. However, when the impurity concentration is decreased due to variations in the steps of making the capacitor, the capacitance C14 of the capacitor is decreased. Therefore, the yield of capacitors may be reduced due to degradation of the high frequency characteristic and the breakdown by the surge voltage.

SUMMARY OF THE INVENTION

It is, therefore, an object of the present invention to provide an MIS capacitor having an approximately constant capacitance even if it is biased in a forward or reverse direction.

It is another object of the present invention to provide an MIS capacitor having good high frequency characteristics.

It is still another object of the present invention to provide an MIS capacitor having a high surge breakdown voltage.

According to an aspect of the present invention, there is provided an MIS capacitor for bipolar integrated circuits, which includes an island region of one conductivity type, a first semiconductor layer of one conductivity type formed in the island region, an insulating layer provided on the first semiconductor layer, a capacitor electrode provided on the insulating layer to provide an MIS capacitor element, and a second semiconductor layer of an opposite conductivity type for providing an PN junction with the first semiconductor layer. When the MIS capacitor element is reverse biased, majority carriers of the second semiconductor layer are supplied to a depletion layer generated in the first semiconductor layer, thereby providing an MIS capacitor having an approximately constant capacitance even if it is biased in a forward or reverse direction.

BRIEF DESCRIPTION OF THE DRAWINGS

The novel and distinctive features of the invention are set forth in the claims appended to the present application. The invention itself, however, together with further objects and advantages thereof may best be understood by reference to the following description and accompanying drawings in which:

FIGS. 5A and 5B are sectional views showing an MIS capacitor according to the first embodiment of the present invention;

Detailed Description of the Preferred Embodiments

Figure 1:
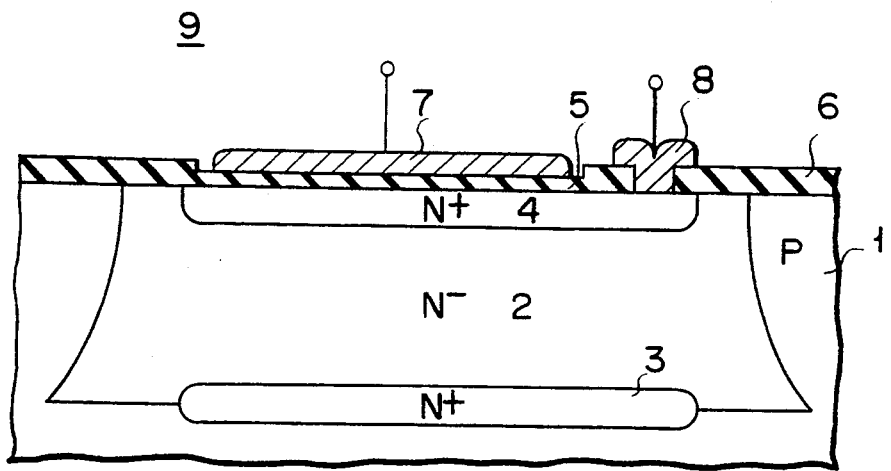
FIG. 1 is a sectional view showing a conventional MIS capacitor.
Figure 2A:
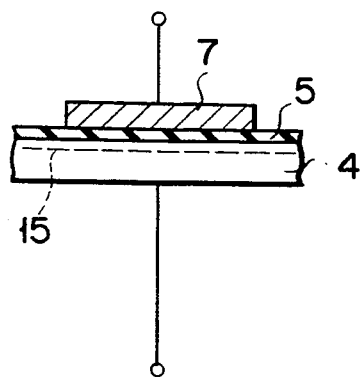
FIGS. 2A to 2C are views for explaining operating conditions of the MIS capacitor.
Figure 2B:
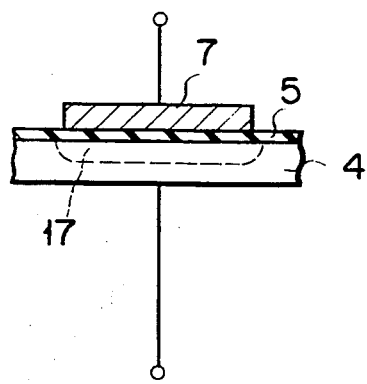
Figure 2C:
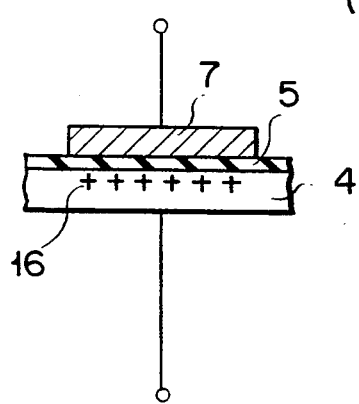
Figure 3:
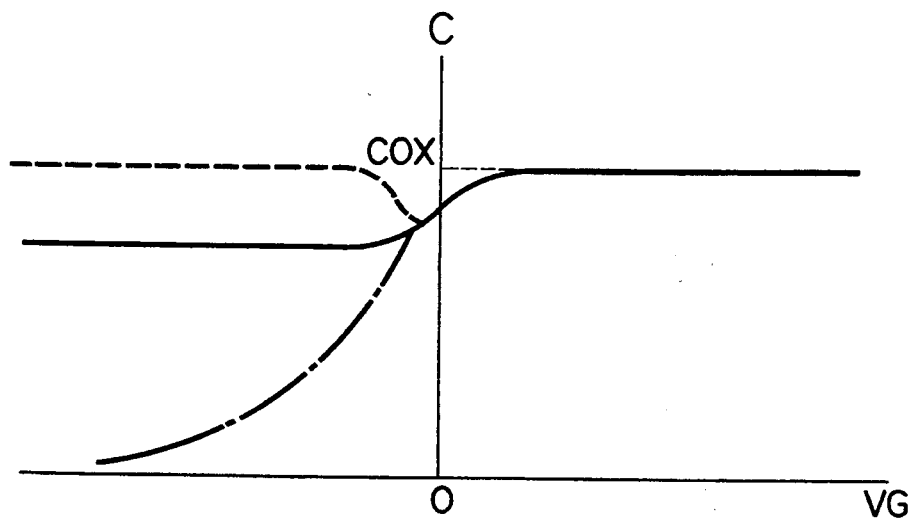
FIG. 3 is a graph showing C-V characteristics of the MIS capacitor.
Figure 4:
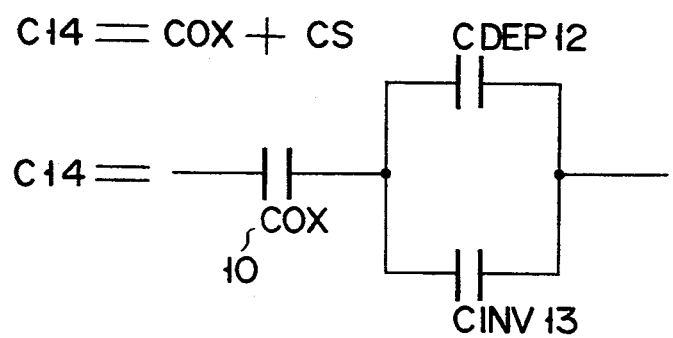
FIG. 4 is a circuit diagram showing an equivalent circuit of the MIS capacitor.

The first embodiment according to the present invention will be described below with reference to FIGS. 5A and 5B.

FIGS. 5A and 5B show an MIS capacitor in which a P-type semiconductor region of an opposite conductivity type is provided so as to be adjacent to a depletion region formed in an N-type semiconductor layer.

Referring to FIG. 5A, a first metal electrode 31 is provided above an N+-type semiconductor layer 24 through a thin insulating layer 28, and the N+-type semiconductor layer 24 is formed in an N−-type semiconductor island region 21. A P-type semiconductor layer 26 is provided in the N+-type semiconductor layer 24 so that an end of a PN Junction 27 is located just under the first metal electrode 31. A second metal electrode 32 is provided through an opening formed in a thick insulating layer 23 so as to overlap both the N+-type semiconductor layer 24 and the P-type semiconductor layer 26, thereby constituting an MIS capacitor. Note that the N−-type semiconductor island region 21 is formed in the P-type semiconductor substrate 20 together with an N+-type buried layer 22 by well known techniques.

Referring to FIG. 5B, the P-type semiconductor layer 26 is formed to have a thickness deeper than that of the N+-type semiconductor layer 24, and the second electrode 32 is provided through an opening formed in the thick insulating layer 23 so as to overlap both the P-type semiconductor layer 26 and an N+-type semiconductor layer 25. The basic structure of the MIS capacitor in FIG. 5B is similar to that of the MIS capacitor in FIG. 5A except for the above description. For providing the MIS capacitor having such a structure, after a P-type impurity is selectively diffused into the N⁻-type semiconductor island region 21 to form the P-type semiconductor layer 26, an N-type impurity is diffused into the N⁻-type semiconductor island region 21 more shallowly than the P-type semiconductor layer 26 to provide the N⁺-type semiconductors layers 24 and 25 therein. In this case, although not shown, the N⁺-type semiconductors layers 24 and 25 are integrally formed and are not separated through the P-type semiconductor layer 26 from each other.

Figure 6:
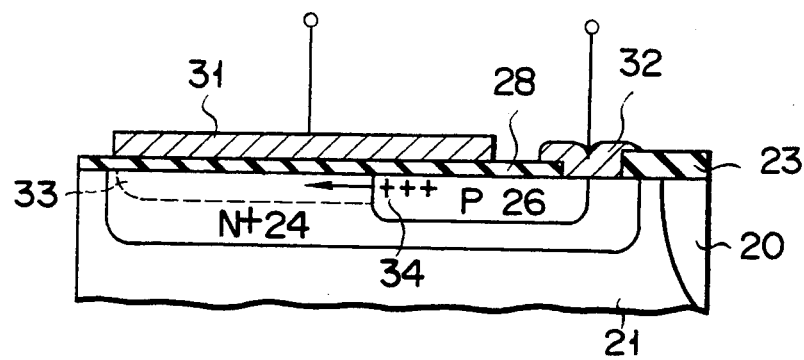
FIG. 6 is a sectional view showing an operation of the MIS capacitor according to the first embodiment.

FIG. 6 shows an operation of the MIS capacitor shown in FIGS. 5A and 5B. That is, a positive potential is applied to the N⁺-type semiconductor layer 24 through the second metal electrode 32, and a negative potential is applied to the first metal electrode 31. Then, a depletion layer 33 begins to extend to the N⁺-type semiconductor layer 24 first. In the conventional capacitor, holes generated in the N⁺-type semiconductor layer serve as inverted carriers. However, in the present invention, since the P-type semiconductor layer 26 connected to the high potential through the second metal electrode 32 is adjacent to the depletion layer 33, holes 34 of majority carriers contained in the P-type semiconductor layer 26 may be supplied to the depletion layer 33, thereby forming an inversion layer.

Holes are originally present in the P-type semiconductor layer 26 as majority carriers. Therefore, even if a high reverse bias voltage including high frequency components is applied to the P-type semiconductor layer 26, the holes may be quickly supplied to the depletion layer. Accordingly, the MIS capacitor may keep the capacitance Cox10 defined by the insulating layer 28.

In order to satisfy the above condition, the depletion layer 33 and the P-type semiconductor layer must be adjacent to each other. If these layers are not adjacent to each other, a bias voltage which is high enough to exceed a potential difference of the PN junction must be applied across the semiconductor layers 24 and 26.

Figure 7A:
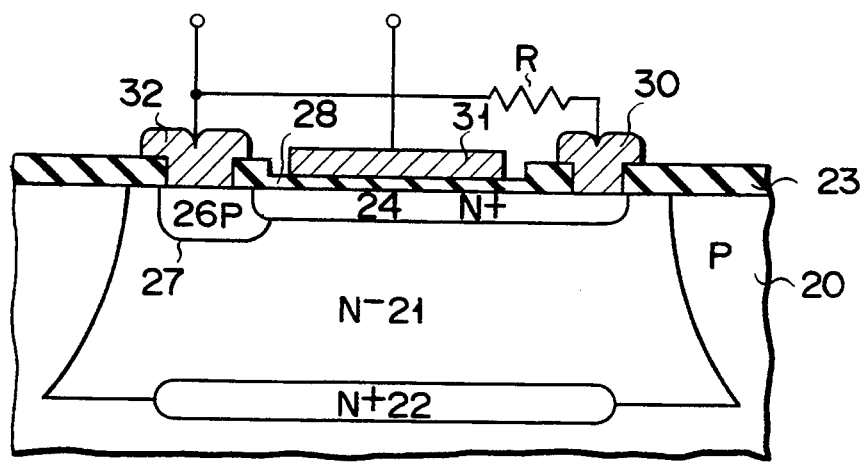
FIGS. 7A and 7B are sectional views showing MIS capacitors according to the second embodiment of the present invention.
Figure 7B:
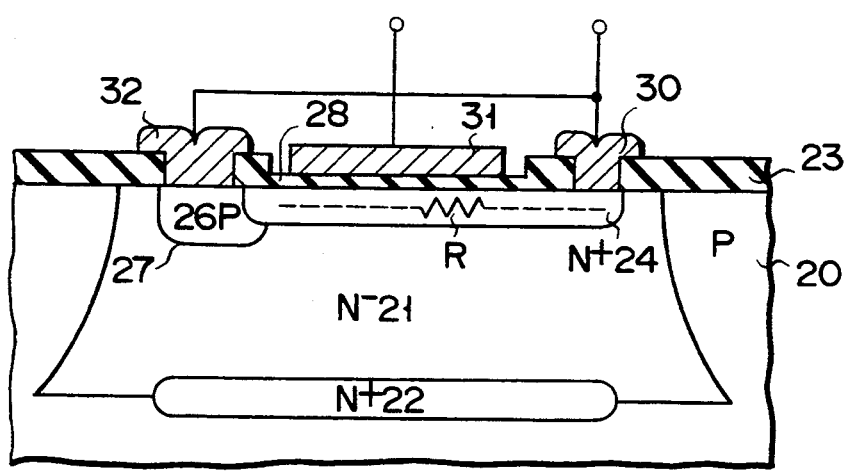

FIGS. 7A and 7B show MIS capacitors according to the second embodiment of the present invention, in which the P-type semiconductor layer of the opposite conductivity type is not located so as to be adjacent to the depletion layer formed in the N-type semiconductor layer, and holes are supplied to the depletion layer by applying a bias voltage to the PN junction.

Reference numerals as in FIGS. 5A and 5B denote the same parts in FIGS. 7A and 7B.

Referring to FIG. 7A, the PN junction 27 is not located under the first metal electrode 31, and an electrode 30 in contact with the N⁺-type semiconductor layer 24 is provided. The electrode 30 is electrically connected to the second metal electrode 32 through a resistor R. The electrode 32 is provided on only the P-type semiconductor layer 26.

In the above MIS capacitor, as described above, since the PN junction is not arranged under the capacitor electrode, i.e., the first metal electrode 31, the P-type semiconductor layer 26 is not in contact with the depletion layer formed in the N⁺-type semiconductor layer 24 unless a high voltage is applied to the first electrode 31.

An operation wherein a reverse bias voltage is applied to the above MIS capacitor will be described below. When the reverse bias voltage is applied to the MIS capacitor a displacement current may immediately flow through the MIS capacitor. The applied voltage and the resistor R are set such that when the displacement current flows through the resistor R, a voltage drop occur to provide a potential difference of 0.6 V across the PN junction 27. In this case, holes are supplied from the P-type semiconductor layer 26 to the N⁺-type semiconductor layer 24, thereby forming an inversion layer in the surface of the N⁺-type semiconductor layer 24. Even if a high frequency bias voltage higher than the voltage for satisfying the above conditions is applied to the MIS capacitor, the capacitance C14 of the capacitor may have Cox10.

In the MIS capacitor shown in FIG. 7B, a resistor component R of the N⁺-type semiconductor layer 24 is used in place of an external resistor. The operation is similar to that shown in FIG. 7A.

As materials for the metal electrodes in the first and second embodiments, polysilicon, aluminum, and silicides of refractroy metals having good electric conductivity such as molybdenum silicide can be utilized.

In the MIS capacitor according to the present invention, the depletion state, which is generated in one conductivity type semiconductor layer of the conventional MIS capacitor when the reverse bias voltage including the high frequency components is applied thereto, is positively controlled by supplying the inversion carriers, that is, the majority carriers contained in the opposite conductivity type semiconductor layer to the one conductivity type semiconductor layer. Therefore, an MIS capacitor can be obtained. The MIS capacitor with approximately constant capacitance will be provided even if it is biased in a forward or reverse direction. The MIS capacitor having good high frequency characteristics and high surge breakdown voltage will be also provided even if the impurity concentration of one conductivity type semiconductor layer is low.

It is further understood by those skilled in the art that the foregoing description is preferred embodiments of the disclosed MIS capacitor and that various changes and modifications may be made in the invention without departing from the spirit and scope thereof.

What is claimed is:

1. A MIS capacitor in a semiconductor integrated circuit device, comprising:
   a semiconductor substrate including an island region;
   a first semiconductor layer of one conductivity type, provided in said island region, having first and second ends opposed to each other;
   an insulating layer provided over said first semiconductor layer;
   a first electrode provided on said insulating layer;
   a second semiconductor layer of an opposite conductivity type formed in said island region to provide a PN junction with said first end of said first semiconductor layer;
   said PN junction intersecting an upper surface of said island region to be spaced apart from an edge of said first electrode;
   a second electrode being in contact with said second semiconductor layer;
   a third electrode attached to said second end of said first semiconductor layer; and
   means for producing a voltage drop across said PN junction when a reverse voltage is applied between said first and second electrodes;
   wherein said voltage drop is given by electrically connecting said second electrode to said third electrode through an external resistor.

2. The MIS capacitor according to claim 1, wherein said island region has the same conductivity type as that of said first semiconductor layer.

* * * * *